United States Patent [19]

Bianchi

[11] Patent Number: 5,122,690

[45] Date of Patent: Jun. 16, 1992

[54] INTERFACE CIRCUITS INCLUDING DRIVER CIRCUITS WITH SWITCHING NOISE REDUCTION

[75] Inventor: Christopher C. Bianchi, Havertown, Pa.

[73] Assignee: General Electric Company, Princeton, N.J.

[21] Appl. No.: 598,507

[22] Filed: Oct. 16, 1990

[51] Int. Cl.⁵ .......................................... H03K 19/003
[52] U.S. Cl. ..................................... 307/475; 307/443; 307/263
[58] Field of Search ............... 307/443, 451, 475, 265; 301/264

[56] References Cited

U.S. PATENT DOCUMENTS

| | | | |
|---|---|---|---|
| 4,333,057 | 6/1982 | Hoover | 330/253 |
| 4,345,213 | 8/1982 | Schade, Jr. | 330/253 |
| 4,360,785 | 11/1982 | Schade, Jr. | 330/261 |
| 4,779,013 | 10/1988 | Tanaka | 307/443 |
| 4,785,201 | 11/1988 | Martinez | 307/451 X |
| 4,785,203 | 11/1988 | Nakamura | 307/443 X |
| 4,818,901 | 4/1989 | Young et al. | 307/451 |
| 4,825,101 | 4/1989 | Walters, Jr. | 307/451 X |
| 4,829,199 | 5/1989 | Prater | 307/443 |
| 5,015,880 | 5/1991 | Drake et al. | 307/443 |
| 5,019,728 | 5/1991 | Sauwo et al. | 307/475 |

OTHER PUBLICATIONS

"Electrical Characteristics of Balanced Voltage Digital Interface Circuits," Electronic Industries Assoc. (EIA) Standard RS-422-A dated Dec. 1978, pp. 1-16.
National Semiconductor Data Sheet DS26C31MJ/883 CMOS Quad Tri-State Differential Line Driver, dated Jun. 1991.
National Semiconductor Data Sheet DS26C32AMJ/883 Quad Differential Line Receiver dated Jun. 1990, pp. 1-6.
National Semiconductor Data Sheet DS26LS32C/DS26LS32M/DS26LS32AC/DS26LS33C/DS26LS33M/DS26LS33AC Quad Differential Line Receivers, pp. 1-50 through 1-52.
Texas Instruments Data Sheet AM26LS32AM, AM26LS33AM, AM26LS32AC, AM26LS33AC Quadruple Differential Line Receivers, dated Sep. 1986, pp. 4-13 through 4-21.
Texas Instruments Data Sheet AM26LS31M, AM26LS31C Quadruple Differential Line Drivers, dated Oct. 1986, pp. 4-5 through 4-12.
Natinal Semiconductor Data Sheet DS26LS31C/DS26LS31M Quad High Speed Differential Line Driver, pp. 1-37 through 1-39.
Natinoal Semiconductor "Military RS-422 Products" dated May 1990.

Primary Examiner—David Hudspeth
Attorney, Agent, or Firm—Clement A. Berard, Jr.

[57] ABSTRACT

An interface circuit includes a generator for driving an interface signal to a receiver which produces an output signal in response thereto. The generator (or driver) includes a pair of relatively larger complementary conductivity field effect transistors and a pair of relatively smaller complementary conductivity field effect transistors (FETs), each pair in series circuit between the supply rails. The interface signal is produced at a connection of the center points of both pairs of FETs. A control device renders like ones of the FETs in each pair alternately conductive responsive to the input signal, however, the control device generates control signals for the FETs such that the relatively smaller FET of a given conductivity becomes conductive before the larger FET of that same conductivity. The receiver includes a voltage divider to attenuating and coupling the received interface signal to a high-gain amplifier which produces the output signal. Preferably, the signals have amplitudes sufficiently large to cause the interface circuit to operate as a digital interface. Further, it is preferred that two generators of opposite signal sense be employed to produce a differential interface signal, in which case the receiver includes a differential amplifier having opposite signal sense inputs to which the differential signals are applied through a differential voltage divider. In the preferred differential amplifier, opposite signal sense outputs are fed back in the regenerative sense to the two inputs to introduce hysteresis.

22 Claims, 3 Drawing Sheets

INTERFACE CIRCUITS INCLUDING DRIVER CIRCUITS WITH SWITCHING NOISE REDUCTION

The present invention relates to electrical interface circuits and to driver and receiver circuits therefor.

Interfacing relates to the way that electrical signals generated in one electrical circuit are transmitted to and received by a second electrical circuit. In most instances, such as where the two circuits are located relatively close together and share common power supplies and grounds, it may involve no more than connecting a signal conductor from one circuit to the other. However, the difficulty of interfacing circuits becomes greater and more complex as the circuits become physically more remote from one another, and as differences between power supply potentials arise and become more pronounced, and as differences between ground potentials arise and become more pronounced. The interface problem is particularly severe where the driving circuit and receiving circuit operate from independent power supplies and when their respective ground potentials may be significantly different, not only in the steady state sense, but also in a dynamic sense.

The simple form of an unbalanced interface connection comprising a signal conductor and a ground conductor may be unsatisfactory under such circumstances. A balanced or differential interface connection which includes two signal wires between which the signal to be communicated between the generating circuit and receiving circuit is carried overcomes many of the aforementioned difficulties.

Attempts to resolve these sorts of interface problems on a uniform basis has lead to the creation of interface specifications which establish performance standards for the interface generator (or driver), the interface load (or receiver), and the interconnecting cable therebetween. One such standard in widespread use is EIA Standard RS-422-A entitled "Electrical Characteristics of Balanced Voltage Digital Interface Circuits" issued in December 1978 by the Electronic Industries Association, which standard is incorporated herein by reference. Examples of the standards for the interface generator established by RS-422-A include that its output signal will be a differential signal having an amplitude of at least 2 volts but no more that 6 volts and that the generator output impedance will be less than 100 ohms. In addition, each of the potentials comprising the differential signal will be no more than 6 volts positive or negative with respect to the ground potential at the driving end. The interface receiver (or load) under RS-422-A must have an input impedance greater than 4,000 ohms, both differentially between the two conductors of the differential inputs and in between each of those conductors and ground. The signal level may be as low as ±0.2 volt and as high as ±6 volts differentially but may include a common-mode voltage component as great as ±7 volts. The interface load or receiver must be able to withstand an input voltage on either conductor with respect to the ground potential at the interface receiver of up to 10 volts of either polarity, i.e. the sum of the common mode and differential voltages could be as high as ±10 volts.

Known interface circuits may generate large current transients during switching due to both load and internal conditions. Conventional drivers employ a single pair of complementary field effect transistors connected in series between the power supply rails in a connection often referred to as a "totem pole" output. This output circuit must be designed to drive whatever load it is specified to be connected to at the interconnection between the two transistors. The transistors must be of sufficient size that they can provide the maximum current that is required by the worst-case static (DC) and-/or dynamic (AC) load conditions. But the actual load conditions can vary considerably and often include, at least to some extent, some capacitance. This results in a large transient current during the switching of the output state from the high level to the low level and from the low level to the high level to charge or discharge that capacitance. This large transient is undesirable because it tends to generate noise and spurious signals, and may produce overshoot and ringing due to inductance and capacitance in the load, which can interfere with the normal operation not only of the circuit generating such transients, but of other circuits to which they may be coupled.

A second condition occurring during output switching with conventional drivers occurs because both the N-channel and P-channel transistors may be conductive simultaneously, i.e., that is the transistor that is on exhibits some delay in turning off, while at the same time the transistor that is off begins to conduct. The result is a "parasitic totem pole" current that is conducted through both transistors directly between the supply rails and contributes nothing to the generation of the desired output signal. This current not only produces noise and spurious signals as previously described for transient currents, but also results in unnecessary power consumption which is undesirable in many, if not most, instances.

A third condition occurs during conditions which are outside of the normal specifications for the load, such as where there is a short circuit or extremely low static impedance between the output and ground. In this case, the driver circuit will be sourcing or sinking a significant amount of current which, if not controlled, can cause damage to the driver circuit. As the size of the field effect transistors is increased to accommodate increased load demands, the severity of this third condition becomes more pronounced. Therefore, it is clear that the conventional totem pole output connection is unsatisfactory in many instances and that an alternative is required.

The foregoing conditions are overcome in an arrangement of the present invention which includes a feedback control responsive to the output of the interface driver to appropriately adjust the drive conditions thereof. Such feedback may include, for example, feedback affecting both timing as well as the relative states of transistors in the outputs of the interface driver. This beneficially results in a controlled ramping of the output signal transition in two distinct slopes with a concomitant and significant decrease in the magnitude of current transients generated during such transition.

The signal interface of the present invention comprises a driving means which produces at least one interface signal at a potential between that of its supply rails. It includes a first pair of field effect transistors (FETs) coupled in series between the supply rails and a second pair of field effect transistors also coupled in series between the supply rails but having channels that are relatively larger (wider) than those of the transistors of the first pair. The interface signal is produced at, and an output is coupled to, the respective series couplings of the first and second pairs of transistors. Control means is responsive to an input signal for alternately rendering like ones of the transistors in the first and second pairs conductive such that the transistor in the first pair is rendered conductive before its counterpart in the second pair is rendered conductive. The receiving means includes a potential divider coupled to its supply rails for receiving the interface signal and producing an attenuated signal responsive thereto. An amplifier is coupled for receiving the attenuated signal and for producing an output signal in response thereto.

Figure 1:
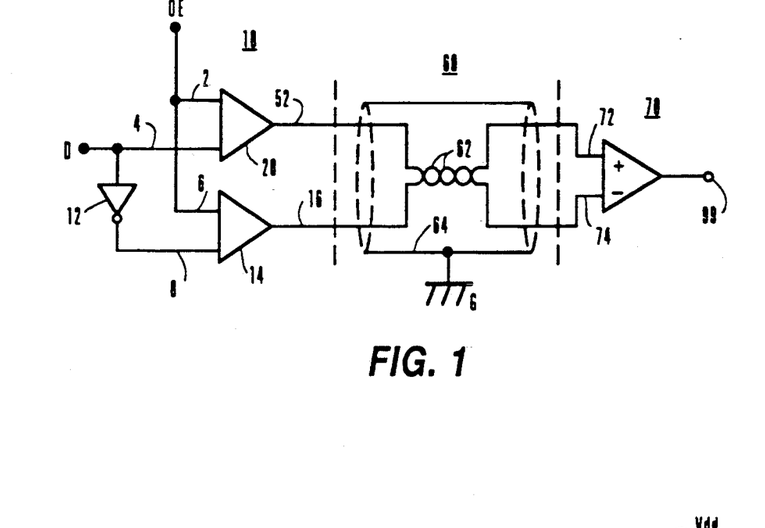
FIG. 1 is a functional diagram of the interface circuit of the present invention.

The balanced voltage interface circuit of FIG. 1 includes interface generator 10, balanced interconnecting cable 60, and interface load 70. Interface generator 10 includes two driver circuits 20 and 14 which would ordinarily be similar, if not identical. An input signal applied at data terminal D is coupled to data input 4 of driver circuit 20 and through inverter 12 to data input 8 of driver circuit 14. Signals responsive thereto are produced at output 52 of interface driver 20 and at output 16 of interface driver 14 in a differential signal sense. That is, the signal at output 52 will be relatively positive with respect to that at output 16 in response to one state of the input signal at terminal D, and the relative polarity senses will reverse with respect to the other state of the input signal at terminal D.

In certain applications it is desirable that interface generator 10 be active and operating only part of the time, for example, where it is one of a plurality of interface generators which produce interface signals to be transmitted by the same interconnecting cable. This may be done for purposes of multiplexing data signals or simply to save power. This is accomplished by an output enable signal applied at terminal OE which is coupled to output enable terminals 2 and 6 of interface drivers 20 and 14, respectively. One state of the output enable signal renders generator 10 active and responsive to the data signal and the other state thereof renders it inactive and non-responsive thereto.

The differential interface signals generated at outputs 52 and 16 of interface generator 10 are coupled to input terminals 72 and 74 of interface receiver 70 via the two conductors 62 of interconnecting cable 60. While only the two conductors 62 are necessary to transmit the balanced interface signal, it is common that these two conductors be twisted together to minimize the pick up of noise and spurious signals and, in addition, they may be enclosed within a conductive shield 64 which is connected to a ground potential at ground G. The balanced, shielded, twisted pair of conductor arrangements are preferred especially where the interface signal must be transmitted over a significant physical distance.

Interface receiver 70 includes differential input terminals 72 and 74 of opposite signal sense and develops an output signal at output terminal 99. The receiver 70, which may include an optional terminating resistor for the interconnecting cable 60, produces an output signal at terminal 99 having voltage levels that are compatible with the circuitry which is to receive such signal.

Figure 2:
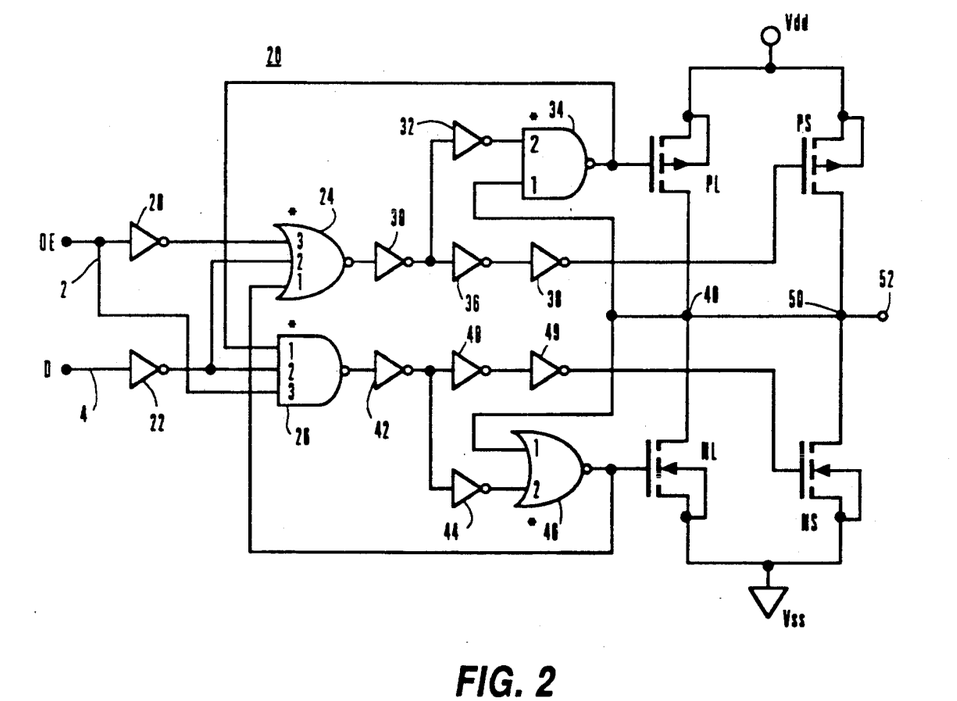
FIG. 2 is a schematic diagram of the interface generator of FIG. 1.

FIG. 2 is a detailed schematic diagram of interface driver 20. It receives power from supply rails Vdd and Vss which typically are at potentials of +5 volts and 0 volts, respectively. Two pairs of complementary conductivity field effect transistors are connected in series between the supply rails Vdd and Vss. In the first pair which have relatively smaller or narrower channels, the source of P-channel field effect transistor PS is connected to supply rail Vdd while its drain is connected via node 50 to output terminal 52. Similarly, the source of P-channel field effect transistor PL which has a relatively wider (or larger) channel is connected to supply rail Vdd while its drain is connected via node 40 to output terminal 52. N-channel field effect transistor NS having a relatively smaller or narrower channel has its source connected to supply rail Vss and its drain to output terminal 52 via node 50. Similarly, N-channel field effect transistor NL having a relatively larger or wider channel has its source connected to supply rail Vss and its drain to output terminal 52 via node 50. These two pairs of series connected complementary field effect transistors are controlled by an arrangement of gates (which will be described in detail below) so that transistors of like conductivity type generally are conductive at the same time. That is to say, transistors PL and PS are both conductive and transistors NL and NS are non-conductive to raise the potential at output terminal 52 substantially to that of supply rail Vdd. Alternately, transistors NL and NS are conductive and transistors PL and PS are non-conductive to make the potential at output terminal 52 substantially that of supply rail Vss.

It is preferred that enhancement-mode complementary metal oxide semiconductor (CMOS) field effect transistors be employed in the circuits previously described as well as those yet to be described. Without limiting the generality and applicability of the invention, however, it is noted that other forms of field effect transistors may also be employed. It is also noted that connections of supply rails Vdd and Vss to the various gates are not shown, such connections being well established in the art.

The remainder of the circuitry of FIG. 2 controls the conduction of the field effect transistors PS, NS, PL and NL in the manner previously described. Thus, the signal applied to the gates of transistors PL and PS and that applied to the gates of transistors NL and NS will be a potential close to that of Vdd when the potential at the output 52 is close to that of supply rail Vss. In the opposite condition, the potentials at the gates are reversed from those of the preceding sentence.

In particular, the field effect transistors PS and NS having relatively smaller or narrower channels are turned on before their counterparts having larger or wider channels, PL and NL, so that the amount of current available to supply output transients is limited, as is the amount of current which can be drawn during a short circuit or low impedance load condition. In addition, because the respective turn-on transitions of smaller channel transistors PS and NS occur after the turn-off transition of the larger channel transistors NL and PL, respectively, the undesirable totem pole current flowing between supply rails Vdd and Vss is almost entirely eliminated by the sequencing of driving the transistors that are conducting toward non-conduction before driving the non-conducting transistor toward conduction. Even if there were to be some overlap in that the smaller channel transistor turning on did so before the larger channel transistor had fully turned off, the totem pole current would be reduced to less than the lower value thereof associated with smaller channel transistors PS and NS rather than the higher level that would be associated with larger channel transistors PL and NL.

The input signal received at data terminal D of the control arrangement and data input 4 is first processed through inverter 22, an optional element provided to insure that the signal levels and transition times of the input signal are adequate and to conveniently make the logical state of the signal at output terminal 52 the same as that of the input signal at data terminal D. The output from inverter 22 is applied to inputs of NOR gate 24 and NAND gate 26 of the control means. Output enable signals received at terminal OE and applied to output enable input 2 are coupled to NAND gate 26 and through inverter 28 to NOR gate 24 to render the control means operative or inoperative as may be desired, it being enabled to operate when the output enable signal is at a logical true or 1 (or a high level in the positive logic sense). The output of NOR gate 24 is coupled through inverters 30 and 32 to an input of NAND gate 34, the output of which is coupled to the gate of transistor PL. The output of NOR gate 24 is also connected via inverters 30, 36, and 38 to the gate of transistor PS. The output of NAND gate 26 is coupled via inverters 42, 48, and 49 to the gate of transistor NS and via inverters 42 and 44 to the input of NOR gate 46, the output of which is connected to the gate of transistor NL. In addition, two sets of logical feedback connections are included, the function of which is described below. The signal at nodes 40 and 50, which is the output signal at terminal 52, is fed back to an input of NAND gate 34 and to an input of NOR gate 46 to affect feedback control over the signal applied to the gates of transistors PL and NL, respectively. In addition, those gate signals of transistors PL and NL are fed back to inputs of NAND gate 26 and NOR gate 24, respectively, to affect the sequencing of transistors PS and PL and that of transistors NS and NL, as is described below.

The operation of interface driver 20 in FIG. 2 is as follows. As a starting point, assume that the output enable signal at OE is a logical 1 and the input signal at terminal D is a logical 0 which produces logical 0's at the outputs of NOR gate 24 and NAND gate 26 which, in turn, produces logical 1's at the outputs of NAND gate 34, inverters 38 and 49, and NOR gate 46. Thus, transistors PS and PL are in their non-conducting or OFF states and transistors NS and NL are in their conducting or ON states producing a logical 0 at potential Vss at output terminal 52. A signal transition is initiated when the input signal at terminal D changes from a logical 0 to a logical 1. This causes the level at input 2 of NAND gate 26 to become a 0 so that its output becomes a logical 1 which is applied via inverters 42, 48, and 49 to transistor NS to drive it toward non-conduction, and via inverters 42 and 44 to input 2 of NOR gate 46 causing its output to change from a logical 1 to a logical 0 which drives transistor NL toward non-conduction. With transistors NS and NL receiving gate potential that drives them to become non-conductive, they begin to become so. The logical 0 level at the output of NOR gate 46, however, is fed back to input 1 of NOR gate 24 which now has logical 0's at all three inputs and so produces a logical 1 at its output which is applied via inverters 30, 36, and 38 to the gate of transistor PS as a logical 0 which causes transistor PS to become conductive.

As thus far described, transistors NS and NL became non-conductive prior to transistor PS becoming conductive, the potential at nodes 40, 50 and output terminal 52 is beginning to change from the potential near that of Vss toward the potential of Vdd. It is noted that during this portion of the transition the current available from supply rail Vdd is only that which can be conducted by the relatively smaller channel transistor PS. Thus, the undesirable totem pole current which otherwise would flow through PS and NL and NS is at a substantially lower level, if not eliminated, as is any transient current to the load connected to output terminal 52. As the potential at output terminal 52 increases toward Vdd due to transistor PS turning on and transistors NS and NL turning off, it eventually reaches the threshold at the input of terminal 1 of input 1 at NAND gate 34 which causes the output thereof to transition to a logical 0 thereby applying drive to the gate of larger channel transistor PL which also begins to turn on to supply the necessary drive current demanded at output terminal 52 and drive the potential thereat close to that of Vdd.

Note that there is an inherent delay between the time at which the gate level and transistor NL changes and the time at which is to make that transistor non-conductive and when the gate potential of the small P-channel transistor PS changes to make that conductive, the delay being determined by the propagation of NOR gate 24 and inverters 30, 36, and 38. These predetermined stage delays are sufficient that the transistor which is becoming non-conductive substantially can do so before the transistor turning on exhibits significant conduction thereby virtually eliminating the undesirable totem pole current transient described above.

A complementary process occurs when the input signal at data terminal D transitions from a logical 1 to a logical 0 in that the sequence of transition on output transistors is in the order of transistors PS and PL being driven to non-conduction and then transistor NS being driven toward conduction followed by transistor NL being likewise driven when the potential at node 40 has dropped sufficiently toward that of supply rail Vss to cause NOR gate 46 to respond thereto, as is evident to those conversant with the art of digital logic circuits.

It is further noted that where the load condition on output terminal 52 is not within specification but is either a short circuit or a low static impedance, the potential at terminal 52 will be unable to depart sufficiently from that of supply rail Vdd or Vss, as the case may be, so that NAND gate 34 and NOR gate 46 will be held in appropriate condition so that transistors PL and NL will both be maintained in a non-conducting or OFF condition. This means that the current that can be supplied into such out-of-specification load condition is limited to the lower current level that is available through the smaller channel transistor PS or NS, as the case may be, rather than the undesirable larger current that would be available if larger channel transistors PL or NL were to be conductive. This beneficially limits the current drain and the possibility of damage to any circuit or component when such out-of-specification condition arises.

Note that when a short circuit current condition occurs or a current condition exceeding the specified maximum level occurs, the large channel output transistor is shut off, limiting the output drive current to that which can be to the safe level of that which can be supplied by the small channel transistor. In the event the short circuit condition or the excessive current condition is removed, then the gate drive is automatically restored to the appropriate large channel transistor and normal operation of the interface driver 20 resumes, as intended, without intervention.

Figures 3, 4, 5:
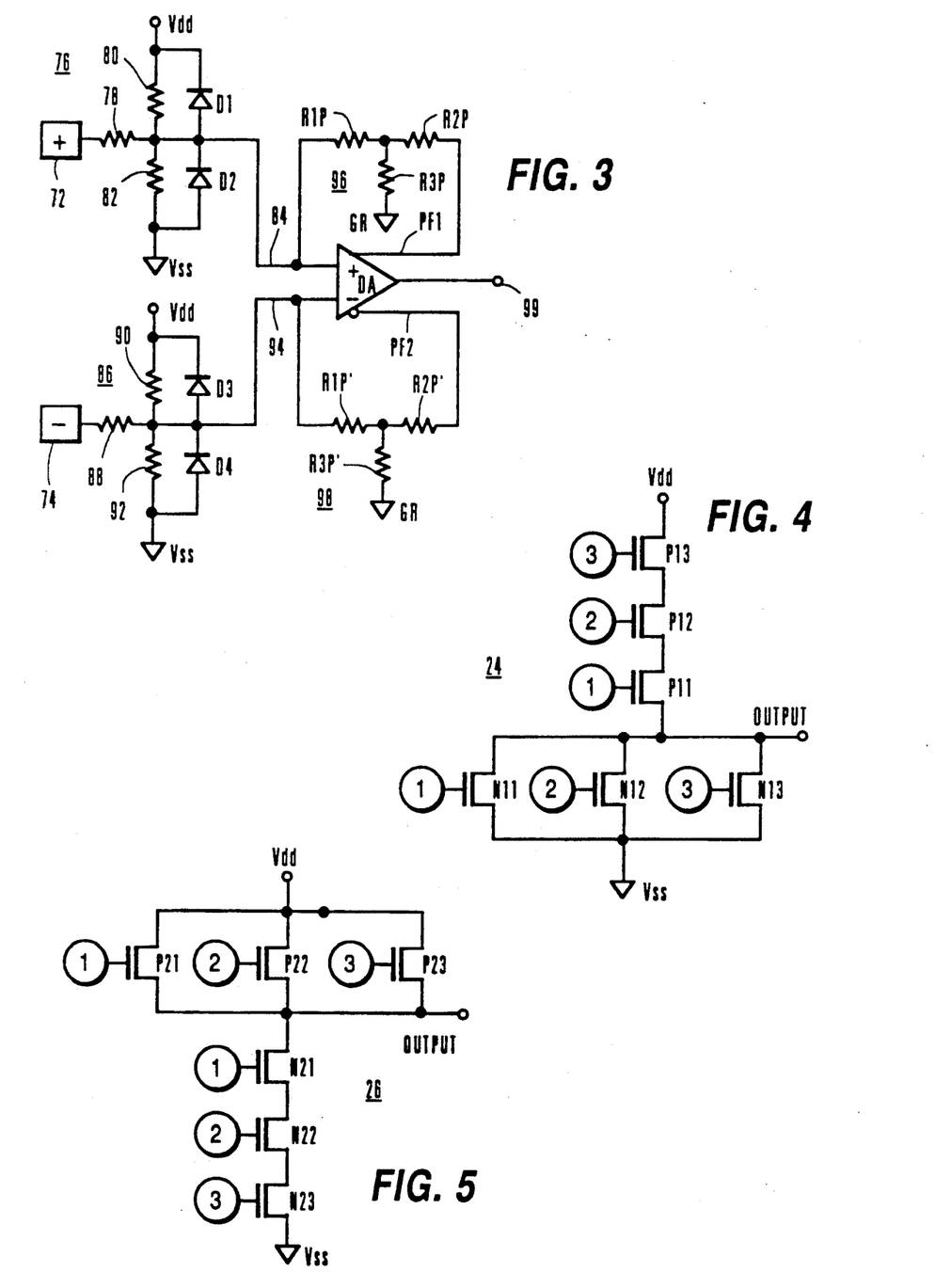
FIG. 3 is a schematic diagram of the interface receiver of FIG. 1.
FIGS. 4 and 5 are schematic diagrams of details of the interface generator of FIG. 2.

It is noted that the NOR gates 24 and 46 and NAND gates 26 and 34 are elements in the feedback arrangement providing the beneficial effect of reduced transient currents and reduced or eliminated totem pole currents that arise from the sequenced switching operation of the transistors PS, NS, PL, and NL. These elements are marked with an asterisk (*) indicating that, while not necessary, a particular arrangement of the inputs to these gates is preferred to further enhance the sequencing and desirable results of the present invention. A detailed schematic of the NAND gate 26 is shown in FIG. 5 and for NOR gate 24 in FIG. 4. In these figures, the numbers in circles correspond to the numbers of the input thereto in the symbolic representation thereof used in FIG. 2.

FIGS. 4 and 5 show a conventional complementary field effect transistor NOR gate and NAND gate, respectively, and are included herein to show that in the respective portions thereof wherein three transistors are connected in series between the output terminal and one of the supply rails, the transistor closest to the output terminal is preferred to be the transistor whose gate connects to the input of the logical circuit that receives the feedback signal in the control means of interface driver 20. This beneficially provides a larger threshold with respect to the supply rail to which the series connected FETs connect before the gate will change conductive state, thereby enhancing the described operation within the control means of interface driver 20. Where the gate has a fewer number of inputs such as do NAND gate 34 and NOR gate 46, the arrangements of FIGS. 4 and 5 would reflect those arrangements if the transistors are connected to input 3 (e.g., P13 and N23) are replaced with a short circuit and those in the parallel connection of transistors that are shown as connected to input 3 (e.g., N13 and P23) are simply removed.

With the particular transistor affecting the transition of the large channel output transistor being closest to the output node of the gate, the fastest response available from the NAND gate or NOR gate, as the case may be, is obtained. This has the beneficial affect of providing the fastest response in the control loop under the potentially dangerous condition of output short circuit or excess load current.

Returning to the operation of driver 20 of FIG. 2, when the output enable signal at OE is a logical 0, NAND gate 26 must produce a logical 1 which via the intervening gates makes the gate drive signals to transistors NL and NS to approach the potential at Vss maintaining both these transistors non-conductive. Similarly, NOR gate 24 must produce a logical 0 which via the intervening gates makes the gate drive signals to transistors PL and PS to approach Vdd maintaining both these transistors non-conductive. Neither of gates 24 and 26 is responsive to data signal D and the output at terminal 52 exhibits a high impedance, permitting for example, its connection to a bus carrying multiplexed signals.

It is further noted that the interface driver described above may be implemented in many ways, however, it is preferred that it be implemented in a CMOS monolithic integrated circuit of which many types and processes are known in the art. In applicant's particular embodiment, a 1.25 micron, "twin-tub," double metallization, very large scale integration (VLSI), CMOS process implemented in bulk silicon was employed. This process desirably produces integrated circuits exhibiting resistance to ionizing radiation, which is beneficial where the circuit is intended for use in a space satellite. In that embodiment the four field effect transistors comprising the output of driver 20 were selected to have a ratio of 3:1 between the channel widths of the large and small transistors. For example, smaller width P-channel field effect transistor PS employed a channel 1.6 microns long and 630 microns wide, whereas wider channel P-channel field effect transistor PL employed a channel 1.6 microns long and 1,890 microns wide. In fact, each of those channels is actually a parallel connection of an appropriate number of channels, each being 1.6 microns long by 5-8 microns wide. Smaller N-channel field effect transistor NS employed a channel 1.4 microns long and 200 microns wide, whereas larger N-channel field effect transistor NL employed a channel 1.4 microns long and 600 microns wide (maintaining the aforementioned 3:1 ratio). The channels of the N-channel transistors were likewise comprised of a plurality of 5—8 micron wide channels in parallel.

It is noted that the foregoing channel length and width dimensions for NL, NS, PL and PS are those "drawn" on the masks used to fabricate an integrated circuit, and that such circuit as fabricated has an effective channel length of about 1.2 microns for both P- and N-channel FETs, as a result of process characteristics. Even though the "drawn" channel widths of the P- and N-channel FETs are quite different, they are selected so that corresponding devices (e.g. PL and NL, PS and NS) exhibit substantially similar electrical performance. It is further noted that the actual length and width of the channels will also vary with the specification requirements as well as with the particular process which is used to fabricate the integrated circuit.

FIG. 3 is a detailed schematic of interface receiver 70 which includes a resistance termination comprising networks 76 and 86 and a differential amplifier DA producing an output signal at terminal 99. Positive and negative supply rails Vdd and Vss for interface receiver 70 are given the same designations herein, however, it should be noted that in an actual application the supply rails may be energized from a different power supply than are those of interface driver 10 and so may be at a different potential as may also be the case with respect to the signal ground of interface receiver 70 which is designated as GR herein. Resistive divider network 76 receives at its input 72 an interface signal in response to which an attenuated signal is produced at node 84. Divider 76 includes resistor 78 in series with the input to limit the input current required as well as to cooperate with resistors 80 and 82 connected in series between the supply rails to attenuate the input voltage. Diodes D1 and D2 are connected between node 84 and supply rails Vdd and Vss, respectively, as protection, where the actual level of the signal at input 72 is outside the range of potentials between that of Vdd and Vss, as can be the case consistent with EIA Standard RS-422-A as described above or can be the case where high electrostatic potentials may be applied, as may occur during handling or soldering of the integrated circuit. Divider 86 is substantially the same as divider 76 and need not be described in detail.

Note that while the respective resistive dividers 76 and 86 are identical to each other, the static bias point at output nodes 84 and 94 need not be centered between the potential of supply rails Vdd and Vss but may be biased in a manner to facilitate interfacing with the inputs of differential amplifier DA, which may have a dynamic input range that is significantly less than the full range of potentials between that of Vdd and Vss. In a preferred embodiment, dividers 76 and 86 are designed so that the potential at nodes 84 and 94 will be between that of Vdd and Vss under all RS-422-A operating conditions, and diodes D1, D2, D3 and D4 are non-conductive.

The attenuated signals at nodes 84 and 94 are applied to the non-inverting and inverting inputs, respectively, of differential amplifier DA, which greatly amplifies those signals to produce the output signal at terminal 99. It is desirable, however, to avoid situations where incorrect output signals are generated, either during a transition or because noise or spurious signals may be present at node 84 or node 94 or both. To that end, hysteresis is included to make certain that once differential amplifier DA commences to respond to a changing signal at its inputs it will do so consistently and rapidly. This is accomplished by applying an amplified output signal of differential amplifier DA back to its input in a positive feedback sense. While the output signal at terminal 99 can be used for such purpose, applicant prefers to provide additional outputs from differential amplifier DA for this purpose. A first output signal at positive feedback output PF1 is coupled through resistive network 96 to provide positive feedback at the non-inverting (or "+") input terminal of amplifier DA, whereas an opposite signal sense signal at positive feedback output PF2 provides, via resistive network 98, a signal in a positive signal sense and the inverting (or "−") input thereof.

Resistive networks 96 and 98 preferably provide a relatively large resistance between the outputs PF1 and PF2 and the non-inverting and inverting inputs, respectively, of amplifier DA so as to provide in cooperation with the impedances at nodes 84 and 94 established by resistive dividers 76 and 86, respectively, an appropriate level of hysteresis. A resistive tee network provides a way to achieve such high resistance while using actual resistors of a relatively modest value. Where the series resistors R1P and R2P of the tee network are of relatively high value as compared to that of the shunt resistor R3P, the effective resistance Reff exhibited by the network is approximately:

$$Reff = \frac{R1P \times R2P}{R3P}$$

It is noted that the regenerative feedback applied via networks 96 and 98 to nodes 84 and 94 from amplifier outputs PF1 and PF2 is preferably symmetric and differential so that like but opposite polarity positive feedback hysteresis is created at the non-inverting and inverting inputs of amplifier DA. This balanced symmetric differential feedback also tends to eliminate sensitivity caused by tolerances or environment, i.e., manufacturing tolerance on resistors or other elements, variation in the potentials at supply rails Vdd and Vss, and changes in voltage, resistance or gain due to temperature or aging, or other external effects such as accumulated radiation dose.

In one embodiment employing a bulk silicon VLSI CMOS process, polysilicon resistors were employed having the following values which are consistent with the requirements of RS-422-A.

TABLE

| Resistor Designation | Resistor Value |
| --- | --- |
| 78 | 15 KΩ |
| 88 | 15 KΩ |
| 80 | 4 KΩ |
| 90 | 4 KΩ |
| 82 | 3 KΩ |
| 92 | 3 KΩ |
| R1P | 17 KΩ |
| R2P | 17 KΩ |
| R1P' | 17 KΩ |
| R2P' | 17 KΩ |
| R3P | 1 KΩ |
| R3P' | 1 KΩ |

Figures 6, 7, 8:
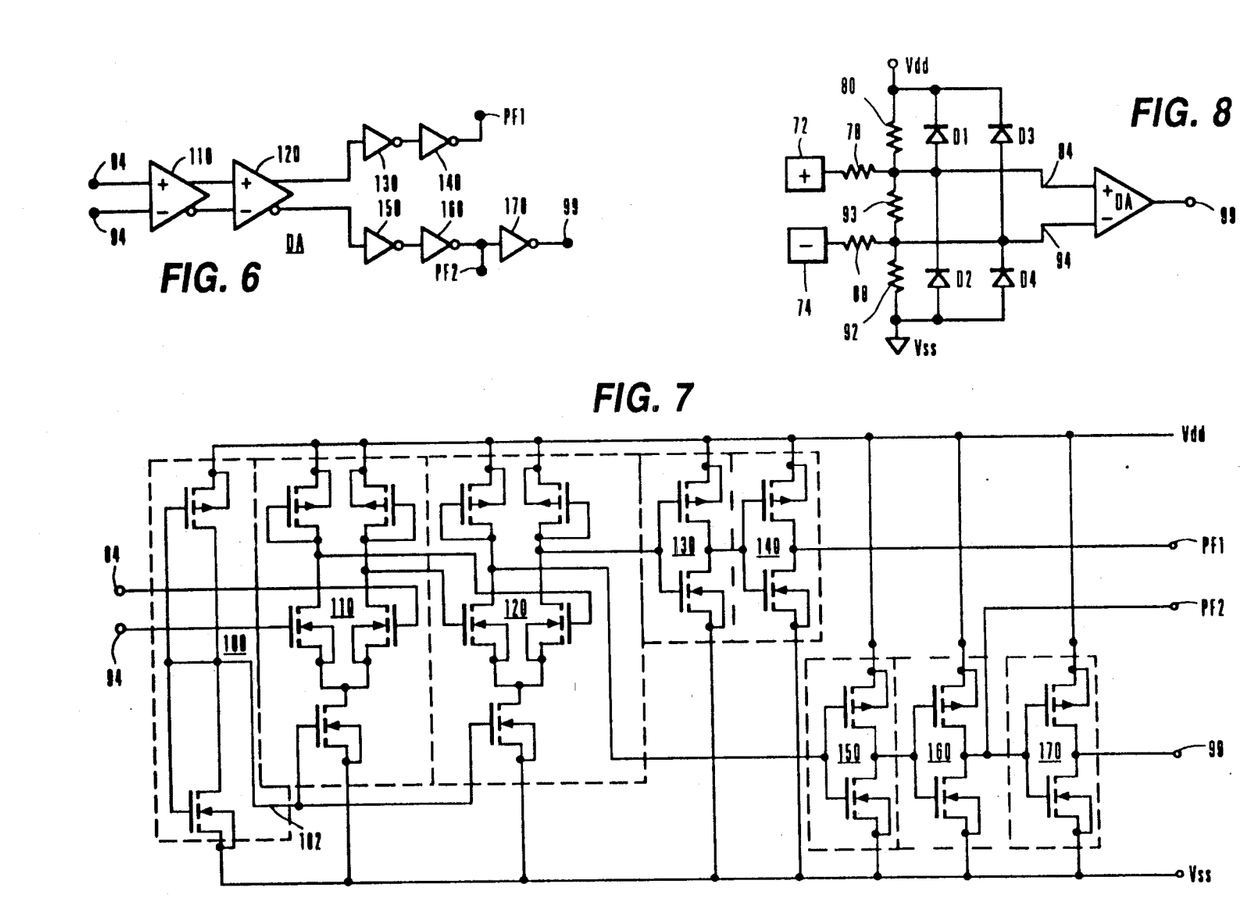
FIGS. 6, 7, and 8 are schematic diagrams of details of the interface receiver of FIG. 3.

FIG. 6 is a schematic diagram showing additional details of differential amplifier DA which includes two cascaded differential stages, each having non-inverting and inverting inputs and differential outputs, and providing substantial amplification of the signals received at nodes 84 and 94. The uninverted output from differential amplifier stage 120 is coupled through two inverting amplifier stages 130 and 140 to generate the signal at terminal PF1 preferred to be used for positive feedback. The doubly inverted but opposite sense signal at the other output of differential amplifier stage 120 is coupled via inverting amplifier stages 150 and 160 to terminal PF2 at which the signal for positive feedback to the inverting input is generated. That signal is further amplified by inverting amplifier stage 170 to produce the output signal at terminal 99. It is pointed out that while it would be possible to use the signals at other points along the chain of inverting amplifiers 150, 160, and 170 for a source of signals to provide positive feedback to the inverting and non-inverting inputs of amplifier DA, the arrangement shown provides for a balanced configuration in which the same number and types of amplifying stages are employed between the respective inputs to differential amplifier DA and the respective feedback outputs PF1 and PF2. This tends to provide approximately equivalent amplifications and time delays between the inputs and terminals PF1 and PF2. Amplifier stages 130, 140, 150, and 160 are all substantially identical so that the amplification and delay through each of the respective paths to PF1 and PF2 are as close as attainable consistent with the tolerances of processing a monolithic integrated circuit.

It is noted that the operation of the differential amplifier DA may be in a saturated output mode wherein the transistors in the last stage and absent prior stages reaches its maximum signal excursions. That is, the output transistors are substantially saturated and the output potential is as close to Vdd or Vss, as the case may be, as can be obtained from such circuit thereby operating differential amplifier DA as a comparator.

FIG. 7 is a further detail of differential amplifier DA of FIG. 6 in which one particular arrangement of transistors is shown. Therein a biasing arrangement 180 comprising P-channel and N-channel FETs series connected between supply rails Vdd and Vss and having their drains connected to their gates for establishing a potential on the connection 182. This causes the N-channel field effect transistors which are in current mirror arrangement therewith and connected in the tails of long-tail pairs of FETs within differential amplifier stages 110 and 120 to serve as current sources for the respective pairs of N-channel field effect transistors connected in differential long-tail paired configuration. These long-tail pairs are connected to receive input signals at their respective gates and to provide output signals at diode connected P-channel transistors which are loads for their respective drains. Single ended inverting amplifiers 130, 140, 150, 160, and 170 are each pairs of complementary conductivity field effect transistors connected in series between supply rails Vdd and Vss.

A monolithic integrated circuit implementation of said circuit has the advantage of providing very closely matched transistors where such is beneficial. For example, the pairs of N-channel transistors in differential amplifier stage 110 would be constructed proximate each other, of identical size and geometry, and located in the same electrically-isolated P-well of the integrated circuit, as would the corresponding transistors in differential amplifier stage 120. Similarly, the P-channel transistors which serve as the drain loads in differential amplifier stage 110 would be alike in size and geometry as would be the corresponding transistors in differential amplifier stage 120. Similarly, the P- and N-channel transistors in stage 130 would be sized relative to each other for equivalent performance and would be identical in respective size and geometry to their corresponding counterparts in amplifier 150. A similar arrangement would exist between the transistors in amplifiers 140 and 160. The P- and N-channel transistors in inverting amplifier 170 would likewise be sized relative to one another for complementary performance characteristics and would likely be larger in size and geometry than those in the preceding similarly configured amplifier stages where the load anticipated to be connected to output terminal 99 would require a substantial current.

FIG. 8 illustrates an alternative to the two resistive dividers 76 and 86 shown in FIG. 3. Elements of FIG. 8 serving like functions to those in FIG. 3 are designated by the same characters primed. An advantage of this alternative embodiment is that it eliminates one resistor as well as eliminates errors that may be caused by tolerance variations in the values of the corresponding resistors in a fabricated circuit. While such may not be of consequence in a digital interface receiver, it may be beneficial in an interface receiver that receives analog signals.

While the foregoing description of the invention is described principally in terms of a balanced voltage digital interface, it is contemplated that the arrangements of the present invention are applicable to unbalanced or single ended interfaces as well as to balanced interfaces and to interfaces carrying analog signals as well as to those carrying digital signals. In a balanced analog interface arrangement, for example, the signals produced by differential amplifier DA at its feedback outputs PF1 and PF2 would instead be applied via resistive networks 96 and 98 to the inverting and non-inverting inputs, respectively, of amplifier DA so as to provide a balanced differential negative feedback establishing and controlling the gain of said amplifier.

Similarly, the interface driver of FIG. 2 can be arranged to conduct analog signals wherein the particular feedback arrangement restricting the relatively larger channel transistors PL and NL from being conductive when the potential at output terminal 52 is relatively close to the potential of supply rail Vdd, or the potential of supply rail Vss, would similarly provide analog overcurrent protection in the event of an out-of-specification load resistance or short circuit, and the interfacing of analog signals thereto being within the level of ordinary skill in the art.

Likewise, various constructions of the arrangements described herein can be made, for example, in integrated circuit form using various processes available in bulk silicon or silicon-on-sapphire ("SOS") or silicon-on-insulator ("SOI") substrates, or other approaches, as well as in CMOS or PMOS or NMOS or gallium arsenide processes, or in constructing the particular arrangements from discrete components such as transistors, resistors, and diodes.

Different arrangements of the circuits described herein may also be employed. For example, in the interface driver of FIG. 2, inverter 22 may be eliminated, as may be inverters 30, 32, 36, 42, 44, and 48, without affecting the functional operation of the circuit described herein, within the level of ordinary skill in the art. In addition, the various gates and inverters therein may employ any form of logic, such as TTL or ECL for example, where the low power consumption obtainable with a CMOS logic implementation is not necessary.

Accordingly, applicant should be granted the benefit of the full scope and breadth of his invention in accordance with the claims below.

What is claimed is:

1. An interface circuit comprising:
   driving means for producing at least one interface signal at a potential between that of first and second supply rails, said driving means including:
   first and second field effect transistors coupled in series and respectively to said first and second supply rails, each of said first and second transistors having a given channel width,
   third and fourth field effect transistors coupled in series and respectively to said first and second supply rails, said third and fourth transistors having given channel widths larger than those of said first and second transistors, respectively,
   output means at which said interface signal is produced coupled to the series coupling of said first and second transistors and to the series coupling of said third and fourth transistors, and
   control means coupled to said first, second, third and fourth transistors for alternately rendering said first and third transistors conductive and said second and fourth transistors conductive in response to an input signal, said control means further for rendering said first transistor conductive before rendering said third transistor conductive, and said second transistor conductive before rendering said fourth transistor conductive; and
   receiving means receiving said interface signal for producing an output signal at a potential between that of third and fourth supply rails in response to said input signal, said receiving means including:
   potential dividing means coupled to said third and fourth supply rails and for receiving said interface signal, and having a node at which an attenuated signal directly responsive to said interface signal is produced, and
   amplifying means coupled between said third and fourth supply rails and having an input connection coupled to said node for receiving said attenuated signal, for producing said output signal in response thereto.

2. The interface circuit of claim 1 further comprising:

second driving means of the same arrangement of the first driving means as set forth in claim 1, wherein the control means of said second driving means is responsive to a signal complementary to said input signal, whereby the output means of said second driving means produces an interface signal which is of opposite signal sense to the interface signal produced by the output means of the first driving means; and said potential dividing means of said receiving means further including means for receiving the interface signal produced by said second driving means and having a second node at which a second attenuated signal directly responsive thereto is produced, and wherein said amplifying means as a second input connection of opposite signal sense to said input connection and coupled to said second node for receiving said second attenuated signal, said amplifying means producing said output signal in response to the difference between said attenuated signal and said second attenuated signal.

3. The interface circuit of claim 1 wherein said control means applies first, second, third and fourth control signals to respective gates of said first, second, third and fourth transistors, said control means including: means responsive to said fourth control signal for controlling said first control signal, and means responsive to said third control signal for controlling said second control signal.

4. The interface circuit of claim 3 wherein at least one of said means responsive to said fourth control signal and said means responsive to said third control signal provides a predetermined time delay.

5. The interface circuit of claim 3 wherein at least one of said means responsive to said fourth control signal and said means responsive to said third control signal is responsive to the potential of such control signal.

6. The interface circuit of claim 3 wherein at least one of said means responsive to said fourth control signal and said means responsive to said third control signal includes: a plurality of controllable conductivity devices connected in series between one of said first and second supply rails and a signal node at which the respective one of said first and second control signals is produced, and said one of said fourth and third control signals is applied to a control electrode of the one of said plurality of controllable conductivity devices connected most proximate said signal node.

7. The interface circuit of claim 1 wherein said control means applies first, second, third and fourth control signals to respective gates of said first, second, third and fourth transistors, said control means including means responsive to said interface signal for controlling said third and fourth control signals.

8. The interface circuit of claim 7 wherein said means responsive to said interface signal is responsive to the potential thereof with respect to that of one of said first and second supply rails.

9. The interface circuit of claim 7 wherein said means responsive to said interface signal includes a plurality of controllable conductivity devices connected in series between one of said first and second supply rails and a signal node at which one of said third and fourth control signals is produced, and said interface signal is applied to a control electrode of the one of said plurality of controllable conductivity devices connected most proximate said signal node.

10. A driving circuit for producing at least one interface signal at a potential between that of first and second supply rails, said driving circuit comprising:
first and second field effect transistors coupled in series and respectively to said first and second supply rails;
third and fourth field effect transistors coupled in series and respectively to said first and second supply rails, said third and fourth transistors having channel widths relatively larger than those of said first and second transistors;
output means at which said interface signal is produced coupled to the series coupling of said first and second transistors and to the series coupling of said third and fourth transistors; and
control means coupled to said first, second, third and fourth transistors for applying first, second, third and fourth control signals to respective control electrodes of said first, second, third and fourth transistors for alternately rendering said first and third transistors conductive and said second and fourth transistors conductive in response to an input signal, said control means including means responsive to said fourth control signal for controlling said first control signal, and means responsive to said third control signal for controlling said second control signal, said control means further for rendering said first transistor conductive before rendering said third transistor conductive, and said second transistor conductive before rendering said fourth transistor conductive.

11. The driving circuit of claim 10 wherein at least one of said means responsive to said fourth control signal and said means responsive to said third control signal includes a predetermined time delay.

12. The driving circuit of claim 10 wherein at least one of said means responsive to said fourth control signal and said means responsive to said third control signal is responsive to the potential of such control signal.

13. The driving circuit of claim 10 wherein at least one of said means responsive to said fourth control signal and said means responsive to said third control signal includes: a plurality of controllable conductivity devices connected in series between said one of said first and second supply rails and a signal node at which the respective one of said first and second control signals is produced, and said one of said fourth and third control signals is applied to a control electrode of the one of said plurality of controllable conductivity devices connected most proximate said signal node.

14. The driving circuit of claim 10 wherein said control means includes means responsive to said interface signal for controlling said third and fourth control signals.

15. The driving circuit of claim 14 wherein said means responsive to said interface signal is responsive to the potential thereof with respect to that of one of said first and second supply rails.

16. The driving circuit of claim 14 wherein said means responsive to said interface signal includes a plurality of controllable conductivity devices connected in series between one of said first and second supply rails and a signal node at which one of said third and fourth control signals is produced, and said interface signal is applied to a control electrode of the one of said plurality of controllable conductivity devices connected most proximate said signal node.

17. A receiving circuit for receiving an interface signal and producing an output signal at a potential between that of first and second supply rails in response to said interface signal, said receiving means comprising:
   potential dividing means coupled to said first and second supply rails and for receiving said interface signal, said dividing means having a node at which an attenuated signal directly responsive to said interface signal is produced; and
   amplifying means coupled between said first and second supply rails and having an input means coupled to said node for receiving said attenuated signal, for producing said output signal in response thereto.

18. The receiving circuit of claim 17 wherein said interface signal is a differential signal and wherein:
   said potential dividing means further includes a second node at which a second attenuated signal in differential relationship to the attenuated signal at said first node is produced in response to said differential input signal, and said amplifying means further includes a second input connection of opposite signal sense to that of said input connection, said second input connection being coupled to said second node for receiving said second attenuated signal, said amplifying means producing said output signal in response to the difference between said attenuated signal and said second attenuated signal.

19. The receiving circuit of claim 17 wherein said interface signal is a differential signal and:
   said node of said potential dividing means includes first and second nodes between which said attenuated signal is produced as a differential attenuated signal, and
   the input means of said amplifying means includes differential input connections for receiving said differential attenuated signal.

20. The receiving circuit of claim 19 wherein said amplifying means includes at least two differential-input, differential-output amplifying stages coupled in cascade connection, and at least one inverting amplifying stage is coupled in cascade connection with one of the differential outputs of the last in the cascade of said differential-output amplifying stages, wherein said output signal is produced at an output of the last inverting amplifying stage in said cascade connection.

21. The receiving circuit of claim 20 further comprising:
   at least one inverting amplifying stage coupled in cascade connection with the other of the differential outputs of the last in the cascade of said differential-output amplifying stages, and
   means coupled between the output of the last inverting amplifier in the last mentioned cascade connection and one of the differential input connections of said amplifying means for applying regenerative feedback signals to said amplifying means, whereby said regenerative feedback produces hysteresis.

22. The receiving circuit of claim 21 further comprising means coupled between the output of an inverting amplifying stage in said cascade connection producing said output signal and the other of the differential input connections of said amplifying means for applying regenerative feedback signals to said amplifying means, whereby said regenerative feedback produces hysteresis.

* * * * *

UNITED STATES PATENT AND TRADEMARK OFFICE
CERTIFICATE OF CORRECTION

PATENT NO. : 5,122,690

DATED : June 16, 1992

INVENTOR(S) : Christopher C. Bianchi et al.

It is certified that error appears in the above-identified patent and that said Letters Patent is hereby corrected as shown below:

On title page, item [19] "Bianchi" should be
--Bianchi et al.--.

Item [75], Inventor:  add inventor --David A. Huffman, Douglassville, Pa.--.

Signed and Sealed this

Fifth Day of October, 1993

Attest:

BRUCE LEHMAN

Attesting Officer

Commissioner of Patents and Trademarks